(12) United States Patent
Gunawan et al.

(10) Patent No.: US 12,105,162 B2
(45) Date of Patent: Oct. 1, 2024

(54) MULTI-AXIS MAGNETIC FIELD VECTOR GENERATION

(71) Applicant: International Business Machines Corporation, Armonk, NY (US)

(72) Inventors: Oki Gunawan, Westwood, NJ (US); Evan Laksono, Stanford, CA (US)

(73) Assignee: International Business Machines Corporation, Armonk, NY (US)

(*) Notice: Subject to any disclaimer, the term of this patent is extended or adjusted under 35 U.S.C. 154(b) by 235 days.

(21) Appl. No.: 17/806,590

(22) Filed: Jun. 13, 2022

(65) Prior Publication Data

US 2023/0400535 A1    Dec. 14, 2023

(51) Int. Cl.
*G01R 33/07* (2006.01)
*G01R 33/00* (2006.01)

(52) U.S. Cl.
CPC ....... *G01R 33/072* (2013.01); *G01R 33/0017* (2013.01); *G01R 33/0047* (2013.01)

(58) Field of Classification Search
CPC .............. G01R 33/072; G01R 33/0017; G01R 33/0047
See application file for complete search history.

(56) References Cited

U.S. PATENT DOCUMENTS

| | | |
|---|---|---|
| 7,977,946 B2 | 7/2011 | Teklemariam et al. |
| 8,488,292 B2 | 7/2013 | Steiner |
| 8,525,627 B2 | 9/2013 | Higuchi |
| 9,041,389 B2 | 5/2015 | Gokmen et al. |
| 9,581,657 B2 | 2/2017 | Rasbornig et al. |
| 9,772,385 B2 | 9/2017 | Gunawan et al. |
| 10,197,640 B2 | 2/2019 | Gunawan |
| 10,656,224 B2 | 5/2020 | Buzug et al. |
| 11,193,998 B2 | 12/2021 | Niemann et al. |
| 2003/0208188 A1* | 11/2003 | Ritter ............... A61B 34/70 606/1 |
| 2005/0030138 A1 | 2/2005 | Higuchi |
| 2007/0038410 A1* | 2/2007 | Tunay ............... A61B 5/06 702/150 |
| 2010/0219918 A1 | 9/2010 | Higuchi |
| 2010/0232051 A1* | 9/2010 | Huang ............... G11B 5/0245 360/59 |

(Continued)

FOREIGN PATENT DOCUMENTS

| | | |
|---|---|---|
| CN | 1581373 A | 2/2005 |
| CN | 101900797 A | 12/2010 |

(Continued)

OTHER PUBLICATIONS

American Magnetics, "Multi-Axis Magnet systems for Vector Fields (MAxesTM)," Retrieved from http://www.americanmagnetics.com/datasheets/MAxes_Information_Brief_1-4.pdf, 4 pgs.

(Continued)

*Primary Examiner* — Alvaro E Fortich

(74) *Attorney, Agent, or Firm* — Kelsey M. Skodje

(57) ABSTRACT

A method, system, and computer program product are disclosed. The method includes obtaining a configuration of dipole-line (DL) magnets and selecting a magnetic field (Continued)

vector to be generated. The method also includes determining, based on the configuration, orientations of the DL magnets for generating the magnetic field vector.

20 Claims, 8 Drawing Sheets

(56) References Cited

U.S. PATENT DOCUMENTS

| | | | |
|---|---|---|---|
| 2011/0241812 | A1 | 10/2011 | Teklemariam et al. |
| 2011/0304220 | A1 | 12/2011 | Whitehead |
| 2016/0097823 | A1 | 4/2016 | Feldmeier |
| 2016/0299201 | A1* | 10/2016 | Gunawan ............... G01R 33/07 |
| 2019/0301893 | A1 | 10/2019 | Ruigrok |
| 2019/0383644 | A1* | 12/2019 | Marauska ............... G01B 7/30 |
| 2021/0228298 | A1* | 7/2021 | Qiu ............................ A61B 34/73 |

FOREIGN PATENT DOCUMENTS

| | | | |
|---|---|---|---|
| CN | 102334263 | A | 1/2012 |
| CN | 110319766 | A | 10/2019 |
| EP | 2226815 | B1 | 4/2016 |
| JP | 06224027 | A | 8/1994 |

OTHER PUBLICATIONS

Cryogenic Limited, "Vector Field and Multi-Axis Systems," Retrieved from http://www.cryogenic.co.uk/products/vector-field-and-multi-axis-systems, 2021, 2 pgs.

Gunawan et al., "A Parallel Dipole Line System," https://aip.scitation.org/doi/am-pdf/10.1063/1.4907931, Appl. Phys. Lett. 106, 062407 (2015).

Gunawan et al., "Carrier-Resolved Photo-Hall Effect," Nature 575, 151 (2019), 40 pgs.

Gunawan et al., "The one-dimensional camelback potential in the parallel dipole line trap: Stability conditions and finite size effect," J. Appl. Phys. 121, 133902 (2017), 11 pgs.

Tretiak et al., "Variable single-axis magnetic-field generator using permanent magnets," AIP Advances, 9, 115312, (2019), 9 pgs.

PCT/CN2023/074869, "International Search Report and the Written Opinion of the International Searching Authority", Date of mailing: May 24, 2023, 7 pages.

* cited by examiner

MULTI-AXIS MAGNETIC FIELD VECTOR GENERATION

BACKGROUND

The present disclosure relates to magnetic field vector generation and, more specifically, to magnetic field vector generation using rotating parallel dipole line magnets.

Generation of magnetic field vectors in one to three spatial dimensions (e.g., multi-axis magnetic field vectors) has applications in a wide range of science and engineering fields. For example, modern technological uses of multi-axis magnetic field vectors can include analytical techniques such as magnetic resonance imaging (MRI), magnetic particle imaging (MPI), vibrating sample magnetometry, and measurements based on magnetoresistance, Hall effect, Faraday rotation, magneto-optic Kerr effect, ferromagnetic resonance, etc. These applications typically require a strong direct or alternating current (DC or AC) magnetic field.

SUMMARY

Various embodiments are directed to a method that includes obtaining a configuration of dipole-line (DL) magnets and selecting a magnetic field vector to be generated. The method also includes determining, based on the configuration, orientations of the DL magnets for generating the magnetic field vector. An advantage of the disclosed method can include enabling the generation of magnetic field vectors in one to three dimensions, depending on the configuration. For example, there can be at least one independent/dependent DL magnet pair, at least two parallel independent DL magnets, three mutually orthogonal independent DL magnets, three independent DL magnets positioned at vertices of a triangle, etc. A maximum torque for generating the magnetic field can also be determined. In some embodiments, the DL magnets' orientations can be adjusted based on a magnetic field determined by a Hall sensor. This may be used advantageously to obtain correct orientations of the DL magnets.

Further embodiments are directed to a system, which includes a memory and a processor communicatively coupled to the memory, wherein the processor is configured to perform the method. Additional embodiments are directed to a computer program product, which includes a computer readable storage medium having program instructions embodied therewith, the program instructions executable by a processor to cause a device to perform the method.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
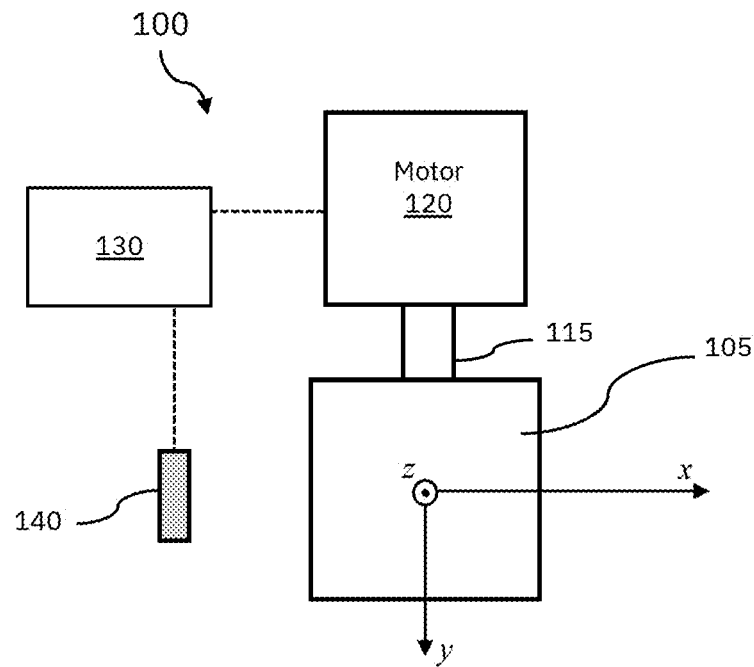
FIG. 1A is a block diagram illustrating a magnetic field vector generation environment, according to some embodiments of the present disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present invention are generally directed to magnetic field vector generation and, more specifically, to magnetic field vector generation using rotating parallel dipole line magnets. While the present disclosure is not necessarily limited to such applications, various aspects of the disclosure may be appreciated through a discussion of examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "over," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects and/or combinations of aspects as described in the specification and the claims.

Unless otherwise noted, ranges (e.g., time, concentration, temperature, etc.) indicated herein include both endpoints and all numbers between the endpoints. Unless specified otherwise, the use of a tilde (~) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc.").

Turning now to an overview of technologies relevant to aspects of the present disclosure, generation of magnetic field vectors has wide-ranging applications that can include analytical techniques such as magnetic resonance imaging (MRI), magnetic particle imaging (MPI), vibrating sample magnetometry, and measurements based on magnetoresistance, Hall effect, Faraday rotation, magneto-optic Kerr effect, ferromagnetic resonance, etc. For example, techniques such as Hall effect measurements can be used in semiconductor characterization. In general, applications involving magnetic field vectors require a generation of a strong direct or alternating current (DC or AC) magnetic field.

Traditional techniques for generating strong magnetic field vectors can include using one or more electromagnetic coils, such as a Helmholtz coil configuration of a pair of coils. However, coil-based implementation can require a bulky setup, a cooling system for large field operation, and an expensive power supply system. Further, an electromagnetic coil system is essentially a large inductor, making it difficult to obtain a large magnetic field at high frequency due to large impedance.

Embodiments of the present disclosure may overcome disadvantages of electromagnetic coil systems by generating magnetic field vectors with permanent magnets. Permanent magnets, such as permanent rare-earth magnets, may be used to generate a large magnetic field on the order of, for example, ~1 Tesla or higher and have been used in configurations such as Halbach arrays, dual rings, magnetic disks, and parallel dipole line magnets. Use of permanent magnets may provide more flexibility in the architecture of a magnetic field vector generator system.

The disclosed techniques can include using dipole line (DL) magnetic configurations to generate magnetic field vectors in one to three spatial dimensions. A DL magnet, also known as a diametric magnet, is a cylindrical permanent magnet with magnetization oriented along its diameter (or transverse magnetization). This magnet can be modeled as a linear distribution of a transverse dipole. Pairs of DL magnets having cylindrical axes pointing in the same direction are referred to as PDL magnets. A PDL magnet pair can serve as a diamagnetic trap system that exhibits a camelback confinement potential along the longitudinal axis. In semiconductor metrology, rotating PDL magnets can be used to generate a one-dimensional (1D) AC magnetic field that has been used as a commercial Hall measurement system, which is also referred to as a PDL Hall system.

In some embodiments, DL magnets generate magnetic field vectors with greater cost efficiency than electromagnetic coils. For example, in some embodiments, a DL magnet system does not require the expensive power supply and cooling system of the electromagnetic coil-based system. Additionally, DL magnet systems may achieve a strong magnetic field (e.g., about 1 Tesla or higher) with a more compact setup than coil-based systems. The disclosed DL systems may also be tailored to generate both DC and AC fields in one to three dimensions. These qualities may allow use of DL magnets as basic building blocks for numerous applications involving generation of magnetic field vectors.

Referring now to the drawings, in which like numerals represent the same or similar elements, FIG. 1A is a block diagram illustrating a magnetic field vector generation environment 100, according to some embodiments of the present disclosure.

Environment 100 includes a DL magnet system 105 with at least one motor-driven magnet (not shown in FIG. 1A) connected to a motor 120 via a shaft 115. In some embodiments, the motor 120 is a stepper motor. The shaft 115 of the motor 120 can have an attached gearbox (not shown) for adjusting (e.g., increasing) torque τ in the DL system 105.

Environment 100 also includes a computing system 130 (e.g., the computing system 900 illustrated in FIG. 9) for instrument control, data acquisition, data analysis, etc.

Components of the computing system 130 electrically communicate with a Hall sensor 140, which can be used to determine the orientations of magnets in the DL system 105, and a controller (not shown) for rotating the DL system 105 magnets, adjusting torque via the gearbox/shaft 115, etc. In some embodiments, such as in applications involving photo-Hall measurements for semiconductor device testing, environment 100 can include components (not shown) for carrying out Hall measurements such as a sample stage, measurement chamber, a light source, photodetector, etc. The computing system 130 can be used to control instruments (not shown) with components for source and measure operations, switch matrix and buffer amplifiers, motor control, magnetic field sensors, temperature control, etc.

Figure 1B:
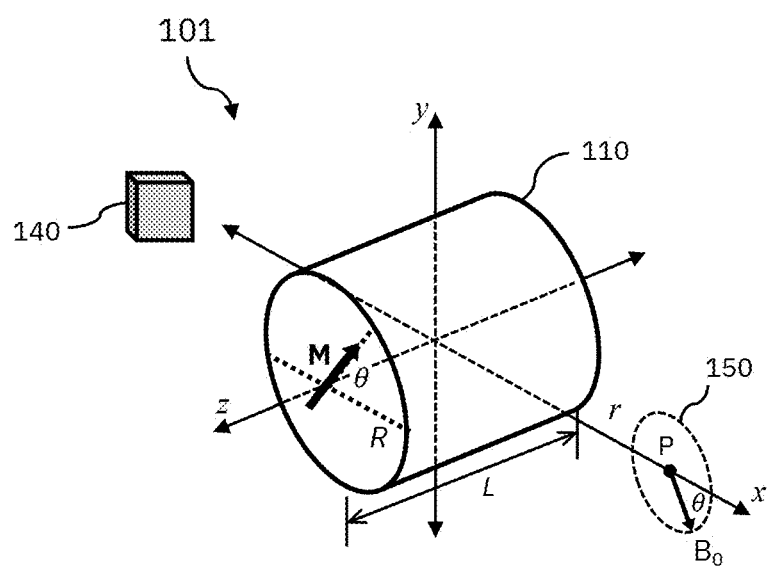
FIG. 1B is a schematic diagram illustrating a dipole-line (DL) magnet configuration, according to some embodiments of the present disclosure.

FIG. 1B is a schematic diagram illustrating a DL magnet configuration 101, according to some embodiments of the present disclosure. Configuration 101 includes a cylindrical magnet 110 of a length L and radius R with transverse magnetization M. This DL magnet 110 can be an example of a single magnet from the configurations having two or more magnets illustrated herein. When the length of magnet 110 is much larger than its radius (L>>R), the magnetic field line outside the magnet 110 is circular on the xy-plane. The field strength profile at a distance r from DL magnet 110 exhibits a transition from line-dipole behavior $B \sim r^{-2}$ in the near field regime (r<L) to point-dipole behavior $B \sim r^{-3}$ in the far field regime (r>L).

The long dipole line magnet 110 can produce a magnetic field $\vec{B}$ represented by the following equation:

$$B(x, y) = \frac{\mu_0 m_L}{2\pi(x^2 + y^2)^2} \begin{bmatrix} x^2 - y^2 \\ 2xy \\ 0 \end{bmatrix} \quad (1)$$

where $\mu_0$ is vacuum permeability, m L is magnetic moment per unit length L, and B is expressed in terms of its cartesian components $\hat{x}$, $\hat{y}$ and $\hat{z}$. The magnet 110 can be rotated (e.g., using motor 120 illustrated in FIG. 1A) to a phase angle θ detected by the Hall sensor 140. Rotating this magnet 110 to an angle θ can produce the following magnetic field:

$$B(x, y) = \frac{\mu_0 m_L}{2\pi(x^2 + y^2)} \begin{bmatrix} (x^2 - y^2)\cos\theta + 2xy\sin\theta \\ (x^2 - y^2)\sin\theta + 2xy\cos\theta \\ 0 \end{bmatrix} \quad (2)$$

The magnetic field B on the xy-plane can be approximated by the field resulting from a long DL magnet (L>>R). Equation 2 is applicable in the near field regime r<L, in which the magnetic field magnitude $B_0$ at a point P on the xy-plane is:

$$B_0 \approx \frac{\mu_0 M R^2}{2r^2} \quad (3)$$

Therefore, the magnetic field magnitude $B_0 = |\vec{B}|$ at point P can be independent of the magnet's 110 orientation. When the magnet 110 is rotated by an angle θ, the magnetic field vector at point P rotates by −θ and sweeps a circular path 150 of radius $B_0$. Given the phase angle θ detected by the Hall sensor 140, the magnetic field vector B at point P may be determined.

In the following examples, magnetic field vectors can be generated by DL magnet system 105 using at least two magnets identical to magnet 110. The magnets can be motor-driven or freely-rotating. While the motor 120 is not illustrated in all of the subsequent figures, it will be understood that the motor-driven magnets can be rotated by a motor such as the motor 120 illustrated in FIG. 1A. Herein, motor-driven and freely-rotating magnets are also referred to as "independent" and "dependent" magnets, respectively.

Figure 2:
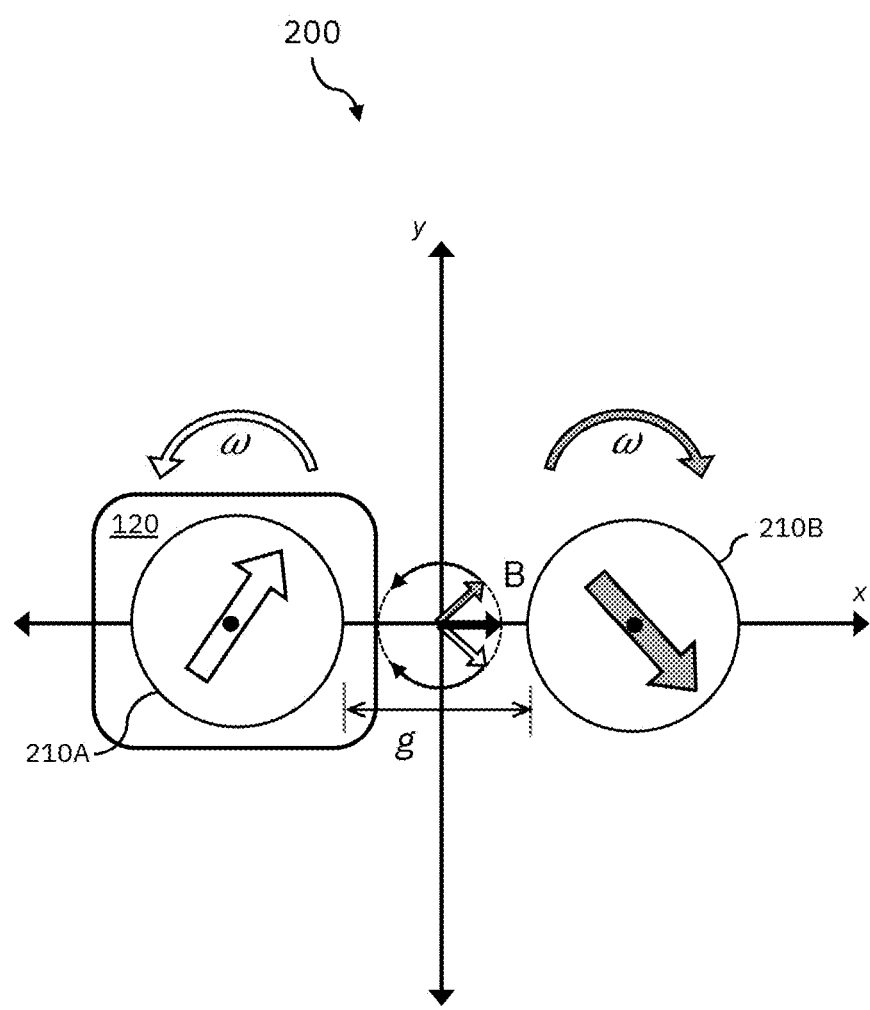
FIG. 2 is a schematic diagram illustrating a DL magnet configuration for generating a one-dimensional (1D) magnetic field vector with a pair of DL magnets, according to some embodiments of the present disclosure.

FIG. 2 is a schematic diagram illustrating a DL magnet configuration 200 for generating a one-dimensional (1D) magnetic field vector, according to some embodiments of the present disclosure. Configuration 200 includes an independent magnet 210A and a dependent magnet 210B (collectively magnets 210). The magnets 210 are separated by a gap of distance g. A one dimensional (1D) oscillating magnetic field B can be generated by using a motor 120 to rotate the independent magnet 210A. The dependent magnet 210B can freely rotate and mirrors the orientation of the motor-driven magnet 210A. The net magnetic field B is always aligned in one direction (x-axis in FIG. 2) since each of magnets 210 produces an opposing magnetic field in the orthogonal direction (y-axis in FIG. 2). The rotation of the magnets 210 produces a unidirectional and single harmonic field B at the center of configuration 200. This 1D oscillating magnetic field B direction (black block arrow) points in the x-direction and takes a sinusoidal form:

$$B(t) = B_0 \cos \omega t \quad (4)$$

where t is time, ω is oscillation frequency, and magnitude $B_0$ which is given as:

$$B_0 \approx \frac{\mu_0 M R^2}{\left(R + \frac{g}{2}\right)^2} \quad (5)$$

where Equation 5 is exact for a long DL magnet where L>>R.

Figure 3:
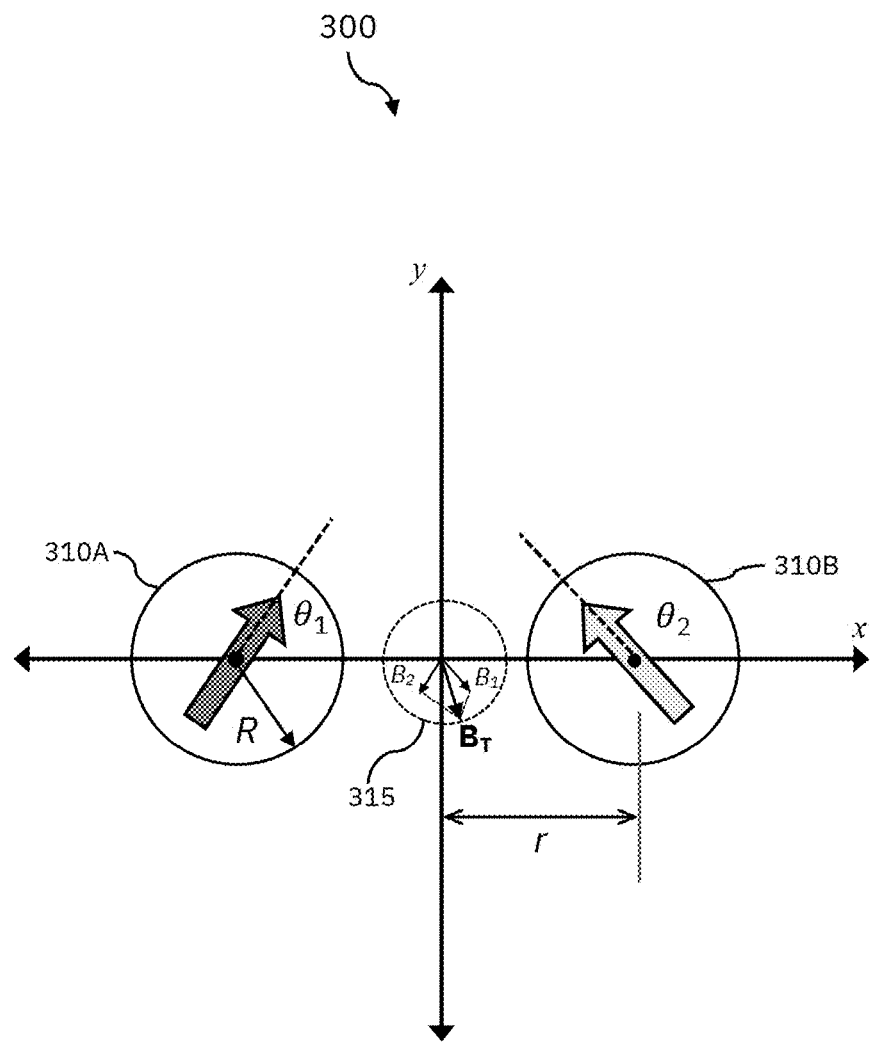
FIG. 3 is a schematic diagram illustrating a magnet configuration for generating a two dimensional (2D) magnetic field vector with two independent DL magnets, according to some embodiments of the present disclosure.

FIG. 3 is a schematic diagram illustrating a magnet configuration 300 for generating a two dimensional (2D) magnetic field vector with two independent DL magnets 310A and 310B (collectively, magnets 310), according to some embodiments of the present disclosure. The magnets 310 can generate a 2D vector at the center of configuration 300. The motor-driven magnets 310 can be independently rotated at angles $\theta_1$ and $\theta_2$ to generate any magnetic field vector with total field amplitude $B_T < B_{max}$ within a circle 315 defined by $B_{max}$. In configuration 300, the maximum magnetic field $B_{max}$ in the limit of a long magnet (L>>R) is given as:

$$B_{max} = 2B_0 = \frac{\mu_0 M R^2}{r^2} \quad (6)$$

where $B_0$ is the maximum magnetic field that can be produced by each magnet at the point of interest at the origin.

In a 1D alternating current (AC) field, $\beta_2=\omega t$ corresponds to the phase of the oscillation. With respect to configuration 300, $\beta_2$ can be defined as:

$$\cos(\beta_2) = \frac{B_T}{2B_0} \quad (7)$$

The orientations of magnets 310A and 310B (respectively, angles $\theta_1$ and $\theta_2$) for generating the total magnetic field vector $B_T=B_T\angle\alpha$ in configuration 300 can be found using Equations 8 and 9 below, where $\alpha$ is the polar angle of vector $B_T$ with respect to +x axis:

$$\theta_1=-\alpha-\beta_2 \quad (8)$$

$$\theta_2=-2\alpha-\theta_1=-\alpha+\beta_2 \quad (9)$$

To calculate the maximum torque needed to turn the magnet, a unit torque $\tau_0$ is defined, as shown in Equation 10:

$$\tau_0 = \pi R^2 M B_0 L = \frac{\mu_0 \pi M^2 R^4 L}{2r^2} \quad (10)$$

The maximum torque $\tau_{max}$ needed to generate a magnetic field vector in configuration 300 can be found using Equation 11:

$$\tau_{max} = \frac{1}{4}\tau_0 = \frac{\mu_0 \pi M^2 R^4 L}{8r^2} \quad (11)$$

Figure 4:
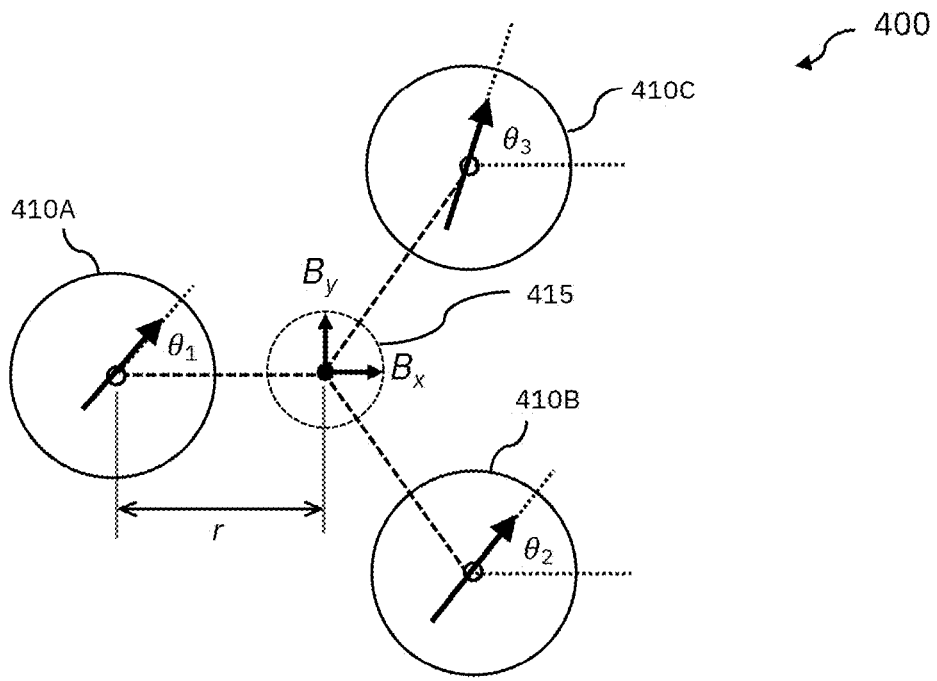
FIG. 4 is a schematic diagram illustrating a magnet configuration for generating a 2D magnetic field vector with three independent DL magnets, according to some embodiments of the present disclosure.

FIG. 4 is a schematic diagram illustrating a magnet configuration 400 for generating a 2D magnetic field vector with three independent DL magnets 410A, 410B, and 410C (collectively 410), according to some embodiments of the present disclosure. In the illustrated example, the magnets 410 are positioned at the vertices of an equilateral triangle at a distance r from the center. However, this configuration 400 can be generalized to other triangular configurations (e.g., where the magnets 410 are positioned at the vertices of an isosceles triangle). The motor-driven magnets 410 can be rotated independently at angles $\theta_1$, $\theta_2$, and $\theta_3$ to generate a 2D vector at the center of configuration 400. In configuration 400, any magnetic field can be generated within a circle 415 defined by $B_{max}=3B_0$. The maximum magnetic field $B_{max}$ generated therein can be given as:

$$B_{max} = 3B_0 = \frac{3\mu_0 M R^2}{2r^2} \quad (12)$$

In determining a scheme for generating the magnetic field vector $B_T=B_T\angle\alpha$ in configuration 400, $\beta_3$ can be defined as follows:

$$\cos(\beta_3) = \frac{B_T}{3B_0} \quad (13)$$

where, in a 1D alternating current (AC) field, $\beta_3=\omega t$ corresponds to the phase of the oscillation.

The angles of magnets 410A, 410B, and 410C for generating the magnetic field vector $B_T=B_T\angle\alpha$ can be found using the following equations:

$$\theta_1 = \beta_3 - \alpha \quad (14)$$

$$\theta_2 = \arg(2\cos\beta_3 - i\sin\beta_3) + \text{sgn}(\beta_3)\arccos\left(\frac{\sqrt{1+3\cos^2\beta_3}}{2}\right) - \alpha - 120° \quad (15)$$

$$\theta_3 = \arg(2\cos\beta_3 - i\sin\beta_3) - \text{sgn}(\beta_3)\arccos\left(\frac{\sqrt{1+3\cos^2\beta_3}}{2}\right) - \alpha + 120° \quad (16)$$

A first magnet 410A can be set to rotate in a simple fashion (linearly with respect to $\beta_3$). This can constrain the rotations of the other two magnets 410B and 410C, which are non-trivial functions of $\beta_3$. The maximum torque $\tau_{max}$ needed in configuration 400 can be given as:

$$\tau_{max} = \frac{2}{3}\tau_0 = \frac{\mu_0 \pi M^2 R^4 L}{3r^2} \quad (17)$$

Figure 5:
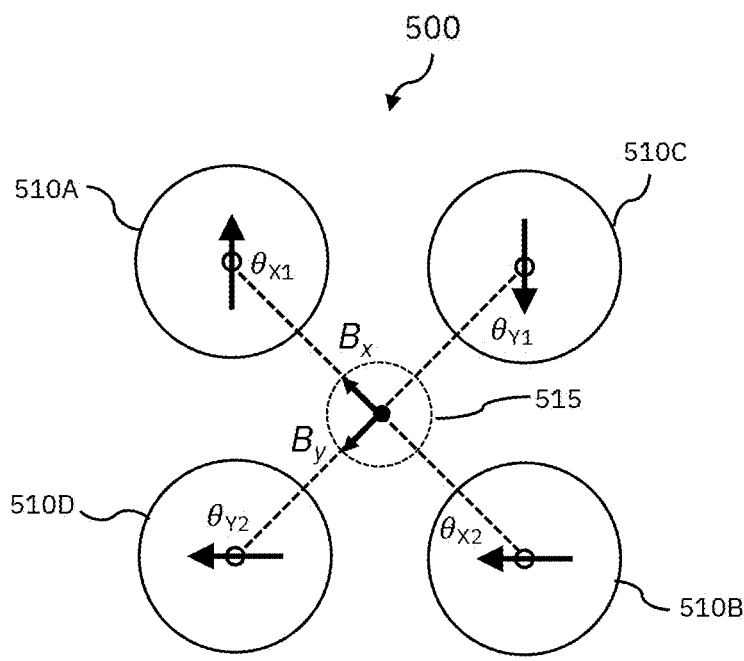
FIG. 5 is a schematic diagram illustrating a magnet configuration for generating a 2D magnetic field vector with four independent DL magnets, according to some embodiments of the present disclosure.

FIG. 5 is a schematic diagram illustrating a magnet configuration 500 for generating a 2D magnetic field vector with four independent DL magnets 510A, 510B, 510C, and 510D (collectively 510), according to some embodiments of the present disclosure. In configuration 500, any magnetic field can be generated within a circle 515 defined by $B_{max}=4B_0$. The motor-driven magnets 510 can be independently rotated at angles $\theta_{X1}$, $\theta_{X2}$, $\theta_{Y1}$, and $\theta_{Y2}$ to generate a 2D vector at the center of configuration 500. The maximum magnetic field $B_{max}$ in configuration 500 can be given as:

$$B_{max} = 4B_0 = \frac{2\mu_0 M R^2}{r^2} \quad (18)$$

In configuration 500, $\beta_4$ can be defined as follows:

$$\cos(\beta_4) = \frac{B_T}{4B_0} \quad (19)$$

The angles of magnets 510 for generating a magnetic field vector $B_T=B_T\angle\alpha$ in configuration 500 can be found using the following equations:

$$\theta_{X1}=\theta_{X2}=\alpha-\beta_4 \quad (20)$$

$$\theta_{Y1}=\theta_{Y2}=\alpha+\beta_4 \quad (21)$$

The maximum torque $\tau_{max}$ needed in configuration 500 can be given as:

$$\tau_{max} = \frac{4}{5}\tau_0 = \frac{5\mu_0 \pi M^2 R^4 L}{8r^2} \quad (22)$$

In principle, configuration 500 may be extended beyond four magnets to produce larger magnetic fields because, in 2D cases, $B_{max}$ scales linearly according to the number N of magnets ($B_{max}=NB_0$). However, these configurations require additional motor drivers.

Figure 6A:
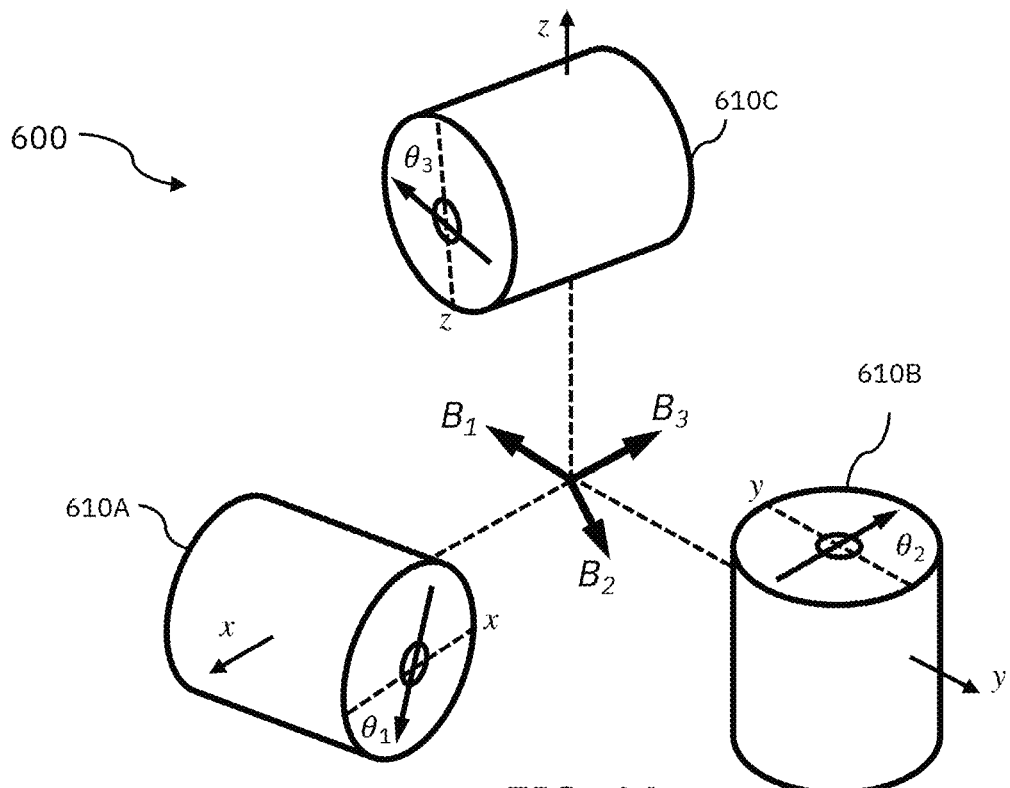
FIG. 6A is a schematic diagram illustrating a magnet configuration for generating a 3D magnetic field with three independent DL magnets, according to some embodiments of the present disclosure.

FIG. 6A is a schematic diagram illustrating a magnet configuration 600 for generating a 3D magnetic field with three independent magnets 610A, 610B, and 610C (collectively 610), according to some embodiments of the present disclosure. The motor-driven magnets 610 can be independently rotated at angles $\theta_1$, $\theta_2$, and $\theta_3$ in order to generate the 3D magnet field vector at the center of configuration 600. The magnet orientations in configuration 600 are mutually orthogonal. Therefore, the magnetic field vector profile of configuration 600 results from the superposition of three vectors ($B_1$, $B_2$, and $B_3$) of equal lengths situated on three orthogonal circular planes. The circular planes are not illustrated in FIG. 6A. This configuration 600 leads to a non-trivial anisotropic profile (see, e.g., FIG. 6B).

Figure 6B:
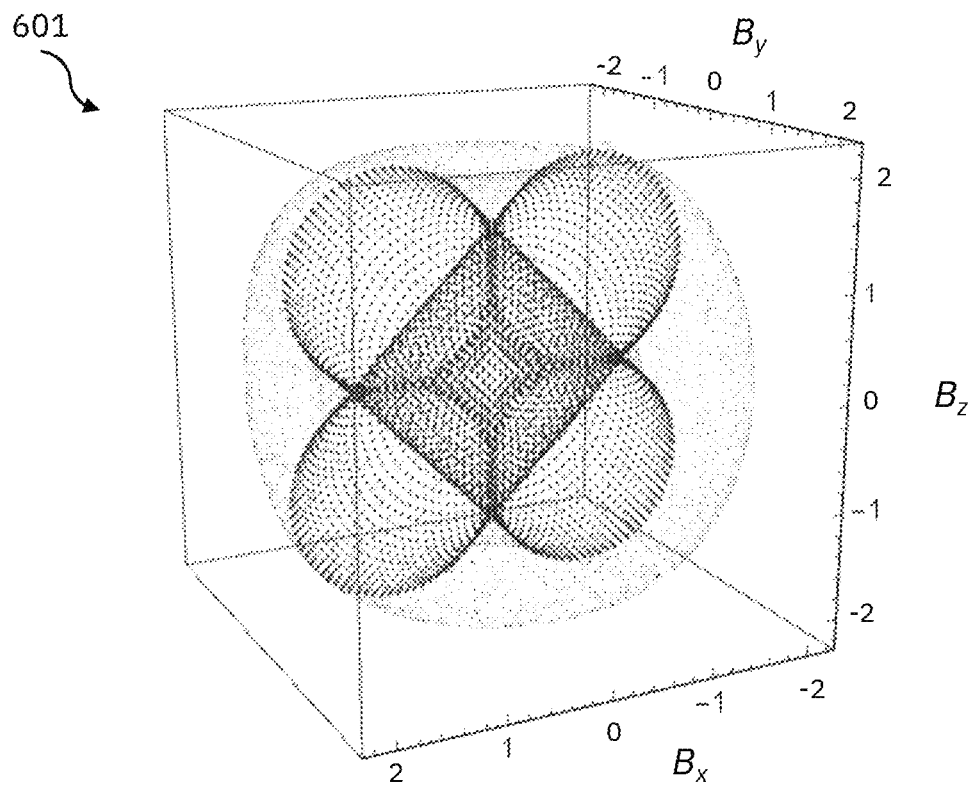
FIG. 6B illustrates an example magnetic field profile resulting from the magnet configuration of FIG. 6A, according to some embodiments of the present disclosure.

FIG. 6B illustrates an example magnetic field profile 601 resulting from configuration 600 (FIG. 6A), according to some embodiments of the present disclosure. The black dots in profile 601 mark a 2D slice of the magnetic field generated on the xz-plane with cusps featuring at the intersection between the profile surface and the main axes. One way to characterize the maximum magnetic field in configuration 600 can be to calculate the maximum attainable field $B_{max}(\hat{b})$ for all orientations $\hat{b}$ and identify its minimum and maximum:

$$B_{max}^0 = \max_{\hat{b}} B_{max}(\hat{b}) = \sqrt{6} B_0 = \frac{\sqrt{6}\mu_0 MR^2 L}{2r^2} \quad (23)$$

$$\overline{B}_{max} = = \min_{\hat{b}} B_{max}(\hat{b}) = \sqrt{2} B_0 = \frac{\mu_0 MR^2 L}{\sqrt{2} r^2} \quad (24)$$

It is noted that configuration 600 may produce a field of magnitude $B_{max}^0$ only on certain axes. However, configuration 600 may produce a field of magnitude $\overline{B}_{max}$ in any direction. This magnitude $\overline{B}_{max}$ corresponds to the cusp feature of the $B_{max}(\hat{b})$ profile 601.

To generate a magnetic field vector $B_T = (B_x, B_y, B_z)$ in configuration 600, the following equations can be solved:

$$\cos(\theta_1) + \sin(\theta_2) = B_x/B_{max} \quad (25)$$

$$\cos(\theta_2) + \sin(\theta_3) = B_y/B_{max} \quad (26)$$

$$\cos(\theta_3) + \sin(\theta_1) = B_z/B_{max} \quad (27)$$

In order to calculate torque for configuration 600, the magnets 610 can be considered finite in length. The resulting torque will depend on the ratio L/R. Assuming that L/R=2 in configuration 600, the maximum torque $\tau_{max}$ can be given by:

$$\tau_{max} > 0.55 \tau_0 \approx 0.55 \times \left( \frac{\mu_0 \pi M^2 R^4 L}{2r^2} \right) \quad (28)$$

Here, only the lower bound is described for the needed torque because $\tau_{max}/\tau_0$ is a decreasing function of distance r. The function eventually saturates to a certain value in the point-dipole (r>L), and the numerical factor is estimated when r>>L.

Figure 7A:
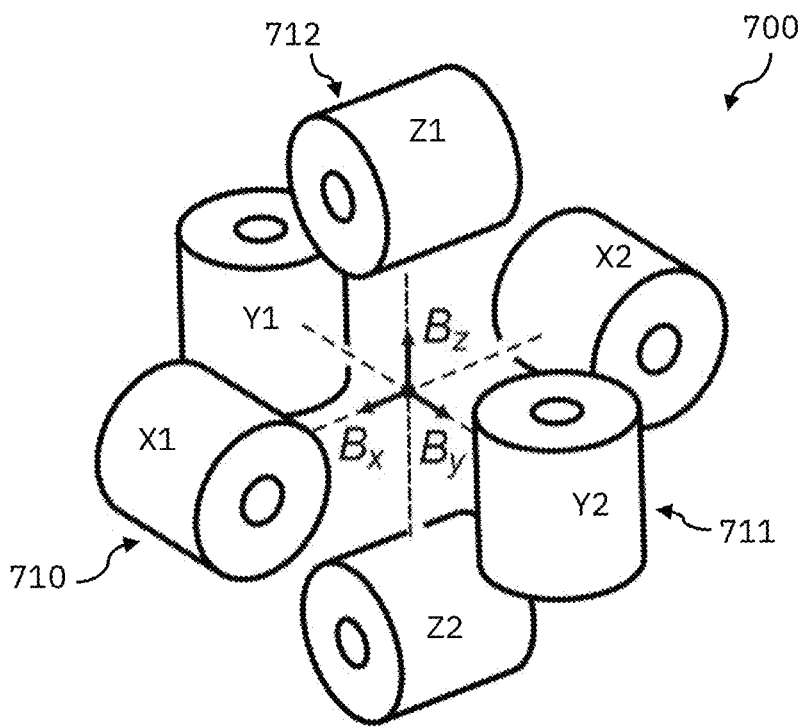
FIG. 7A is a schematic diagram illustrating a magnet configuration for generating a 3D magnetic field with three pairs of DL magnets, according to some embodiments of the present disclosure.

FIG. 7A is a schematic diagram illustrating a magnet configuration 700 for generating a 3D magnetic field with three pairs of DL magnets, according to some embodiments of the present disclosure. The six magnets in configuration 700 include three pairs of magnets 710 (X1 and X2), 711 (Y1 and Y2), and 712 (Z1 and Z2). Each pair includes an independent magnet and a dependent magnet. Each independent magnet from pairs 710, 711, and 712 is a motor-driven magnet that can be independently rotated in order to generate a 3D field at the center. For example, when the independent magnets are X1, Y1, and Z1, motor 120 can be used to rotate the magnets at angles $\theta_{X1}$, $\theta_{Y1}$, and $\theta_{Z1}$. The orientations of magnets 710-712 can be constrained as follows:

$$\theta_{X1} = -\theta_{X2} = \theta_X \quad (29)$$

$$\theta_{Y1} = -\theta_{Y2} = \theta_Y \quad (30)$$

$$\theta_{Z1} = -\theta_{Z2} = \theta_Z \quad (31)$$

Figure 7B:
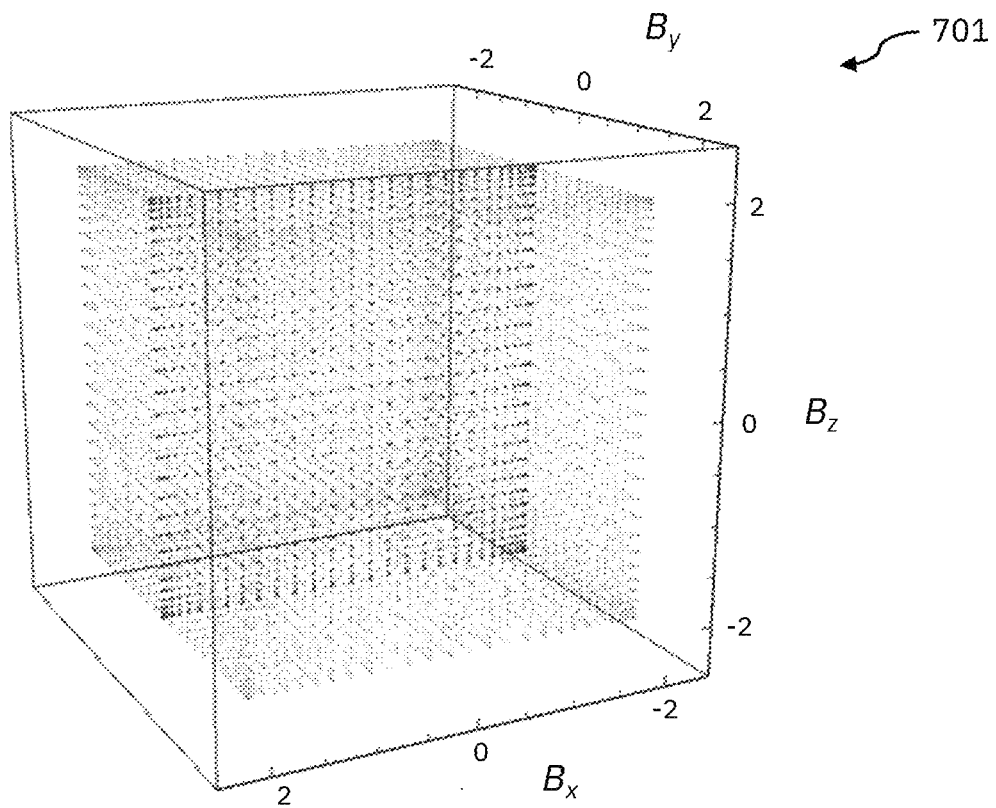
FIG. 7B illustrates an example profile of all possible magnetic field point vectors resulting from the magnet configuration of FIG. 7A, according to some embodiments of the present disclosure.

FIG. 7B illustrates a magnetic field profile 701 that can result from configuration 700, according to some embodiments of the present disclosure. Each pair of independent and dependent magnets 710, 711, and 712 can be used to generate a 1D magnetic field (respectively, $B_x$, $B_y$, and $B_z$) on a cartesian axis (see FIG. 7A). This results in a box shape in the illustrated $B_{max}(\hat{b})$ profile 701, where $B_{max}^0$ and $\overline{B}_{max}$ can be as follows:

$$B_{max}^0 = \max_{\hat{b}} B_{max}(\hat{b}) = 2\sqrt{3} B_0 = \frac{\sqrt{3}\mu_0 MR^2}{r^2} \quad (32)$$

$$B_{max} = = \min_{\hat{b}} B_{max}(\hat{b}) = 2 B_0 = \frac{\mu_0 MR^2}{r^2} \quad (33)$$

To generate a magnetic field vector $B_T = (B_x, B_y, B_z)$ in configuration 700, the orientations of magnet pairs 710, 711, and 712 are given as:

$$\theta_x = \arccos\left( \frac{B_x}{2B_0} \right) \quad (34)$$

$$\theta_y = \arccos\left( \frac{B_y}{2B_0} \right) \quad (35)$$

$$\theta_Z = \arccos\left( \frac{B_Z}{2B_0} \right) \quad (36)$$

In order to calculate torque for configuration 700, the magnets 710, 711, and 712 can be considered finite in length. Assuming that L/R=2 in configuration 700, the required torque can be given by:

$$\tau_{max} > 0.18 \tau_0 \approx 0.18 \times \left( \frac{\mu_0 \pi M^2 R^4 L}{2r^2} \right) \quad (37)$$

As in configuration 600, $\tau_{max}/\tau_0$ in configuration 700 is a decreasing function of distance r, which saturates to a numerical value indicating the lower bound for the required torque.

Figure 8:
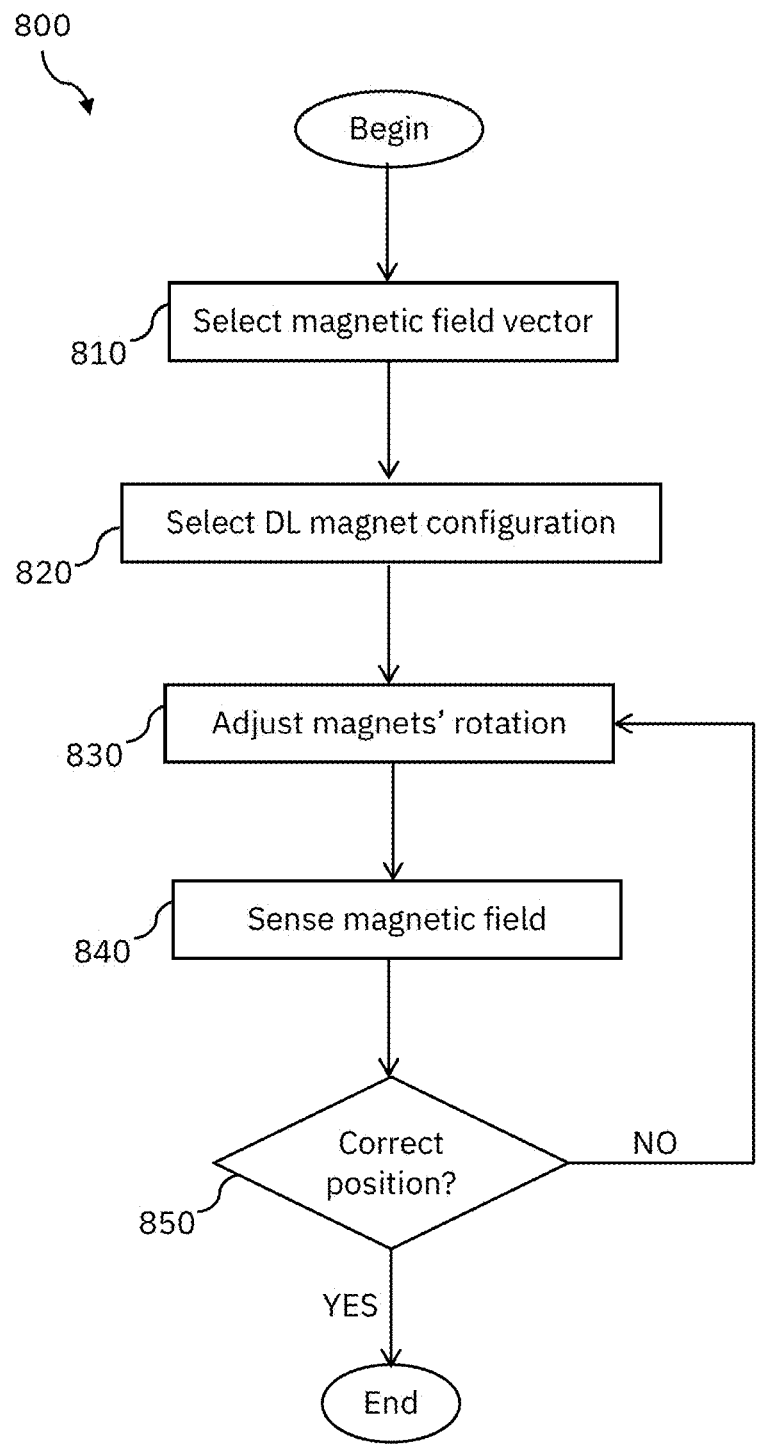
FIG. 8 is a flow diagram illustrating a method of generating a magnetic field vector, according to some embodiments of the present disclosure.

FIG. 8 is a flow diagram illustrating a process 800 of generating a magnetic field vector, according to some embodiments of the present disclosure. Process 800 can generate magnetic field vectors in 1-, 2-, or 3-dimensions using magnet configurations discussed with respect to FIGS. 1-7B. Therefore, process 800 is discussed with reference to these figures.

At operation 810, a magnetic field vector to be generated can be selected. The direction, magnitude, etc. of the magnetic field can be selected based on any appropriate criteria known to persons of ordinary skill in the art. The selected magnetic field vector can be a 1D magnetic field (e.g., configuration 200), 2D magnetic field (e.g., configuration 300, 400, or 500), or 3D magnetic field (e.g., configuration 600 or 700) in a given direction.

A DL magnet system 105 for generating the magnetic field vector can be selected. This is illustrated at operation 820. A configuration such as those illustrated herein can be obtained for the DL system 105 based on the magnetic field vector to be generated. Configuration features selected at operation 820 can include the number of dipole-line magnets (e.g., 1-6 or more magnets), type of rotation (e.g., all motor-driven magnets or pairs of motor-driven and freely rotating magnets), and positions of magnets relative to one another (e.g., parallel or perpendicular axes, cartesian coordinates, etc.). For example, in order to generate a 2D magnetic field vector, configuration 300, 400, or 500 may be selected. Additional features such as magnet length L and radius R, distance r between the magnets and the center of the field to be generated (e.g., point P or center of configuration), size of gap g between an independent magnet and a dependent magnet pair (see, e.g., FIG. 2), etc. can also be selected at operation 820.

The configuration can then be adjusted for the magnetic field vector ($B_T$) to be generated. This is illustrated at operation 830. The computer system 130 can use equations discussed above as appropriate in order to select magnet orientation(s) ($\theta$) and torque ($\tau_{max}$) for generating $B_T$ in the selected configuration. The computer system 130 can communicate with the motor 120, shaft/gearbox 115, and Hall sensor 140 in order to direct adjustments in the DL magnet system 105 at operations 830 and 840.

The magnetic field $B_T$ can be sensed (e.g., by Hall sensor 140) either for each motor or at the point of interest at the center. This is illustrated at operation 840. It is then determined, based on the detected magnetic field, whether the position of the magnets is correct. This is illustrated at operation 850. If the position is incorrect, process 800 returns to operation 830, whereupon the magnets are readjusted (e.g., by rotating the magnets and/or adjusting the torque). The resulting field is sensed at operation 840, and operation 850 is repeated to determine whether the position is correct. Operations 830-850 may be repeated until the magnetic field $B_T$ is generated, as determined based on operations 840 and 850. When the position is correct (yes at 850), process 800 can end.

As discussed above, the magnetic field vector can be generated for a variety of applications and can be used to achieve various magnetic field strengths (e.g., up to about 1 T or higher). In some embodiments, the magnetic field vector is generated to provide a diamagnetic trap, a magnetic field for photo-Hall effect measurements of electron and/or hole mobilities in semiconductors. However, any appropriate magnetic field vector applications can be carried out in environment 100 (e.g., MRI, MPI, vibrating sample magnetometry, magnetoresistance measurements, Faraday rotation measurements, magneto-optic Kerr effect measurements, ferromagnetic resonance measurements, etc.).

Figure 9:
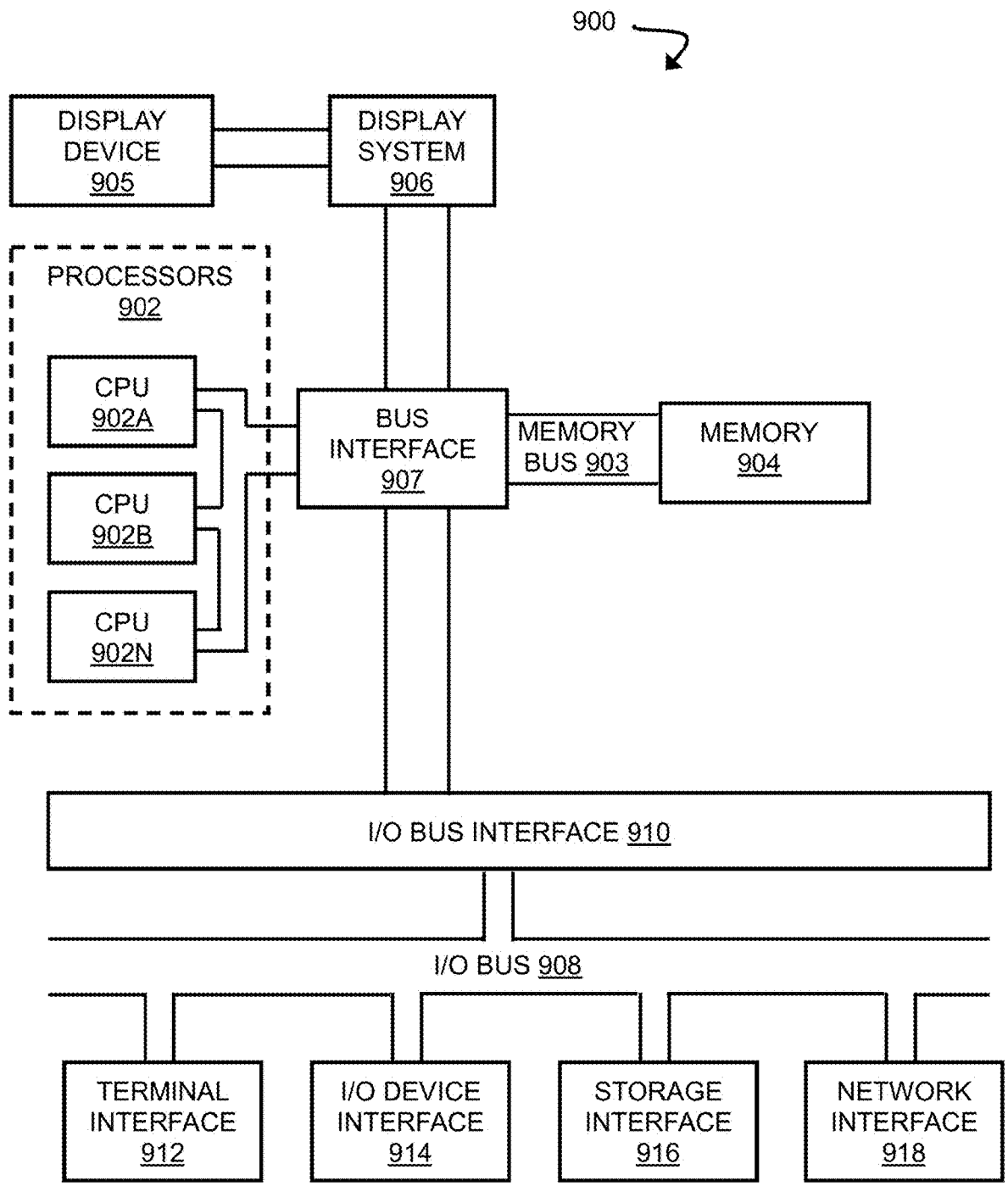
FIG. 9 is a block diagram illustrating a computer system, according to some embodiments of the present disclosure.

FIG. 9 is a block diagram illustrating a computer system 900, according to some embodiments of the present disclosure. The computer system 900 can be used in implementing one or more of the methods, tools, components, and any related functions described herein (e.g., using one or more processor circuits or computer processors of the computer). In some embodiments, the major components of the computer system 900 comprise one or more processors 902, a memory subsystem 904, a terminal interface 912, a storage interface 916, an input/output device interface 914, and a network interface 918, all of which can be communicatively coupled, directly or indirectly, for inter-component communication via a memory bus 903, an input/output bus 908, bus interface unit 907, and an input/output bus interface unit 910.

The computer system 900 contains one or more general-purpose programmable central processing units (CPUs) 902A, 902B, and 902-N, herein collectively referred to as the CPU 902. In some embodiments, the computer system 900 contains multiple processors typical of a relatively large system; however, in other embodiments the computer system 900 can alternatively be a single CPU system. Each CPU 902 may execute instructions stored in the memory subsystem 904 and can include one or more levels of on-board cache.

The memory 904 can include a random-access semiconductor memory, storage device, or storage medium (either volatile or non-volatile) for storing or encoding data and programs. In some embodiments, the memory 904 represents the entire virtual memory of the computer system 900 and may also include the virtual memory of other computer systems coupled to the computer system 900 or connected via a network. The memory 904 is conceptually a single monolithic entity, but in other embodiments the memory 904 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory can be further distributed and associated with different CPUs or sets of CPUs, as is known in any of various so-called non-uniform memory access (NUMA) computer architectures.

Components of the computer system 130 of environment 100 (FIG. 1A), can be included within the memory 904 in the computer system 900. However, in other embodiments, components of system 130 may be on different computer systems and may be accessed remotely, e.g., via a network. The computer system 900 may use virtual addressing mechanisms that allow the programs of the computer system 900 to behave as if they only have access to a large, single storage entity instead of access to multiple, smaller storage entities. Thus, components of the memory 904 are not necessarily all completely contained in the same storage device at the same time. Further, although these components are illustrated as being separate entities, in other embodiments some of these components, portions of some of these components, or all of these components may be packaged together.

In an embodiment, the computer system 130 of environment 100 includes instructions that execute on the processor 902 or instructions that are interpreted by instructions that execute on the processor 902 to carry out the functions as further described in this disclosure. In another embodiment, system 130 is implemented in hardware via semiconductor devices, chips, logical gates, circuits, circuit cards, and/or other physical hardware devices in lieu of, or in addition to, a processor-based system. In another embodiment, system 130 includes data in addition to instructions.

Although the memory bus 903 is shown in FIG. 9 as a single bus structure providing a direct communication path among the CPUs 902, the memory subsystem 904, the display system 906, the bus interface 907, and the input/output bus interface 910, the memory bus 903 can, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the input/output bus interface 910 and the input/output bus 908 are shown as single respective units, the computer system 900 may, in some embodiments, contain multiple input/output bus interface units 910, multiple input/output buses 908, or both. Further, while multiple input/output interface units are shown, which separate the input/output bus 908 from various communications paths running to the various input/output devices, in other embodiments some or all of the input/output devices may be connected directly to one or more system input/output buses.

The computer system 900 may include a bus interface unit 907 to handle communications among the processor 902, the memory 904, a display system 906, and the input/output bus interface unit 910. The input/output bus interface unit 910 may be coupled with the input/output bus 908 for transferring data to and from the various input/output units. The input/output bus interface unit 910 communicates with multiple input/output interface units 912, 914, 916, and 918, which are also known as input/output processors (IOPs) or input/output adapters (IOAs), through the input/output bus 908. The display system 906 may include a display controller. The display controller may provide visual, audio, or both types of data to a display device 905. The display system 906 may be coupled with a display device 905, such as a standalone display screen, computer monitor, television, or a tablet or handheld device display. In alternate embodiments, one or more of the functions provided by the display system 906 may be on board a processor 902 integrated circuit. In addition, one or more of the functions provided by the bus interface unit 907 may be on board a processor 902 integrated circuit.

In some embodiments, the computer system 900 is a multi-user mainframe computer system, a single-user system, or a server computer or similar device that has little or no direct user interface but receives requests from other computer systems (clients). Further, in some embodiments, the computer system 900 is implemented as a desktop computer, portable computer, laptop or notebook computer, tablet computer, pocket computer, telephone, smart phone, network switches or routers, or any other appropriate type of electronic device.

It is noted that FIG. 9 is intended to depict the representative major components of an exemplary computer system 900. In some embodiments, however, individual components may have greater or lesser complexity than as represented in FIG. 9, Components other than or in addition to those shown in FIG. 9 may be present, and the number, type, and configuration of such components may vary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the present disclosure.

What is claimed is:

1. A method, comprising:
   identifying a configuration of a set of dipole-line (DL) magnets;
   selecting a magnetic field vector to be generated; and
   determining, based on the configuration and the magnetic field vector, a first orientation of a first DL magnet in the set and a second orientation of a second DL magnet in the set for generating the magnetic field vector; and
   rotating, by at least one motor, the first DL magnet to the first orientation and the second DL magnet to the second orientation.

2. The method of claim 1, wherein the configuration comprises a pair of the DL magnets, the pair including an independent DL magnet and a dependent DL magnet.

3. The method of claim 1, wherein the configuration comprises two parallel independent DL magnets.

4. The method of claim 1, wherein the configuration comprises three mutually orthogonal independent DL magnets.

5. The method of claim 1, wherein the configuration comprises three DL magnets positioned at vertices of a triangle.

6. The method of claim 1, further comprising determining a maximum torque for generating the magnetic field vector.

7. The method of claim 1, further comprising adjusting orientations of the DL magnets based on a magnetic field determined by a Hall sensor.

8. A system, comprising:
   a memory; and
   a processor communicatively coupled to the memory, wherein the processor is configured to perform a method comprising:
   identifying a configuration of a set of dipole-line (DL) magnets;
   selecting a magnetic field vector to be generated;
   determining, based on the configuration, a first orientation of a first DL magnet in the set and a second orientation of a second DL magnet in the set for generating the magnetic field vector; and
   rotating, by at least one motor, the first DL magnet to the first orientation and the second DL magnet to the second orientation.

9. The system of claim 8, wherein the configuration comprises a pair of the DL magnets, the pair including an independent DL magnet and a dependent DL magnet.

10. The system of claim 8, wherein the configuration comprises two parallel independent DL magnets.

11. The system of claim 8, wherein the configuration comprises three mutually orthogonal independent DL magnets.

12. The system of claim 8, wherein the configuration comprises three DL magnets positioned at vertices of a triangle.

13. The system of claim 8, further comprising determining a maximum torque for generating the magnetic field vector.

14. The system of claim 8, further comprising adjusting orientations of the DL magnets based on a magnetic field determined by a Hall sensor.

15. A computer program product, the computer program product comprising a computer readable storage medium having program instructions embodied therewith, the program instructions executable by a processor to cause a device to perform a method, the method comprising:

identifying a configuration of a set of dipole-line (DL) magnets;

selecting a magnetic field vector to be generated; and determining, based on the configuration, a first orientation of a first DL magnet in the set and a second orientation of a second DL magnet in the set for generating the magnetic field vector; and rotating, by at least one motor, the first DL magnet to the first orientation and the second DL magnet to the second orientation.

16. The computer program product of claim 15, wherein the configuration comprises two parallel independent DL magnets.

17. The computer program product of claim 15, wherein the configuration comprises three mutually orthogonal independent DL magnets.

18. The computer program product of claim 15, wherein the configuration comprises three DL magnets positioned at vertices of a triangle.

19. The computer program product of claim 15, further comprising adjusting orientations of the DL magnets based on a magnetic field determined by a Hall sensor.

20. The method of claim 1, further comprising determining, based on a detected magnetic field generated by the configuration of the DL magnets comprising the rotated magnets in the first and second orientations, a third orientation of the first DL magnet to generate the magnetic field vector.

\* \* \* \* \*